United States Patent
Atungsiri et al.

(10) Patent No.: US 10,250,428 B2
(45) Date of Patent: Apr. 2, 2019

(54) TRANSMITTER AND RECEIVER AND METHODS OF TRANSMITTING AND RECEIVING

(71) Applicant: Sony Corporation, Tokyo (JP)

(72) Inventors: Samuel Asangbeng Atungsiri, Basingstoke (GB); Martin Warwick Beale, Kingsdown (GB)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/523,771

(22) PCT Filed: Nov. 12, 2015

(86) PCT No.: PCT/GB2015/053440
§ 371 (c)(1),
(2) Date: May 2, 2017

(87) PCT Pub. No.: WO2016/075475
PCT Pub. Date: May 19, 2016

(65) Prior Publication Data
US 2017/0338907 A1  Nov. 23, 2017

(30) Foreign Application Priority Data
Nov. 12, 2014 (GB) .................................. 1420117.2

(51) Int. Cl.
*H04L 27/00* (2006.01)
*H04L 27/26* (2006.01)
(Continued)

(52) U.S. Cl.
CPC ........ *H04L 27/2666* (2013.01); *H03M 13/27* (2013.01); *H03M 13/2707* (2013.01);
(Continued)

(58) Field of Classification Search
CPC ... H04L 1/0668; H04L 27/266; H04L 1/0606; H04L 1/0643; H03M 13/2778; H04B 7/02
See application file for complete search history.

(56) References Cited

FOREIGN PATENT DOCUMENTS

| CN | 101778074 | * 3/2010 | ............ H04L 27/26 |
|---|---|---|---|
| CN | 101778074 | 7/2010 | |

(Continued)

OTHER PUBLICATIONS

Digital Video Broadcasting; Next Generation broadcasting system to Handheld, physical layer, Nov. 2012.*

(Continued)

*Primary Examiner* — Lakeram Jangbahadur
(74) *Attorney, Agent, or Firm* — Oblon, McClelland, Maier & Neustadt, L.L.P.

(57) ABSTRACT

A transmitter transmits payload data using Orthogonal Frequency Division Multiplexed (OFDM) symbols, the transmitter including a frame builder to receive the payload data and to receive signalling data for use in detecting and recovering the payload data at a receiver, and to form the payload data into data-units for transmission. A modulator modulates plural sub-carriers of one or more OFDM symbols with the signalling data and the payload data in accordance with a modulation scheme to provide for each of plural sub-carriers a modulation symbol, a prefixing circuit prefixes a guard interval to the one or more OFDM symbols, and a transmission circuit transmits the one or more OFDM symbols. The modulator includes an I/Q interleaver to receive a real component of the modulation symbol of each of the one or more sub-carriers and to interleave the real component of the modulation symbols differently to the imaginary component.

20 Claims, 11 Drawing Sheets

(51) Int. Cl.
*H03M 13/27* (2006.01)
*H04B 7/02* (2018.01)
*H04L 1/00* (2006.01)
*H04L 1/04* (2006.01)
*H04L 1/06* (2006.01)
*H04L 5/00* (2006.01)
*H04L 27/156* (2006.01)
*H04W 56/00* (2009.01)

(52) U.S. Cl.
CPC .......... *H03M 13/2778* (2013.01); *H04B 7/02* (2013.01); *H04L 1/0071* (2013.01); *H04L 1/04* (2013.01); *H04L 1/0668* (2013.01); *H04L 5/0007* (2013.01); *H04L 27/266* (2013.01); *H04L 27/2672* (2013.01); *H04L 27/2695* (2013.01); *H04L 1/0606* (2013.01); *H04L 1/0643* (2013.01); *H04L 27/1566* (2013.01); *H04L 27/2657* (2013.01); *H04L 2027/0065* (2013.01); *H04W 56/004* (2013.01)

(56) References Cited

FOREIGN PATENT DOCUMENTS

| | | | | |
|---|---|---|---|---|
| CN | 103873187 | A | 6/2014 | |
| GB | 2512392 | A | 1/2014 | |
| WO | 2004/073219 | A1 | 8/2004 | |
| WO | WO 2004073219 | * | 8/2004 | ............. H04L 27/26 |

OTHER PUBLICATIONS

Souto, Efficient Detection Technique for Multiple Packet Collisions in OFDM Systems, IEEE, 2009.*

International Search Report dated Mar. 16, 2016, in PCT/GB2015/053440, filed Nov. 12, 2015.
"Digital Video Broadcasting (DVB); Next Generation broadcasting system to Handheld, physical layer specification (DVB-NGH)", DVB Document A160, Nov. 2012, pp. 65-68, XP 002755041.
Huawei, "Modulation diversity for OFDM", 3GPP TSG RAN WG1 #31, Feb. 18-21, 2003, 6 pages, XP 002903416.
Huawei, "Text proposal for Section 4 in TR25.892 on OFDM Modulation Diversity", 3GPP TSG RAN WG1 #32, Aug. 25-29, 2003, 3 pages.
Gao et al., "Enhanced MIMO cooperative communication based on signal space diversity", 2014 9th International Conference on Communications and Networking in China (CHINACOM), Aug. 2014, pp. 432-437, XP 032742089.
Souto et al., "Efficient Detection Technique for Multiple Packet Collisions in OFDM Systems", Vehicular Technology Conference Fall (VTC 2009—Fall), 2009, 5 pages.
Wang et al., "First Cognitive Radio Networking Standard for Personal/Portable Devices in TV White Spaces", 2010 IEEE Symposium on New Frontiers in Dynamic Spectrum, Apr. 6, 2010, 12 pages, XP 031664849.
Doan et al., "Iterative Packet Combining Schemes for Intersymbol Interference Channels", IEEE Transactions on Communications, vol. 50, No. 4, Apr. 2002, pp. 560-570.
ETSI, "Digital Video Broadcasting (DVB); Frame structure channel coding and modulation for a second generation digital terrestrial television broadcasting system (DVB-T2)", ETSI EN 302 755 V1.3.1, Apr. 2012, 188 pages.
Boutros et al., "Signal Space Diversity: A Power- and Bandwidth-Efficient Diversity Technique for the Rayleigh Fading Channel", IEEE Transactions on Information Theory, vol. 44, No. 4, Jul. 1998, pp. 1453-1467.
Holma et al., "WCDMA for UMTS-HSPA Evolution and LTE", Fourth Edition, 2007, 26 pages.
"ATSC 3.0 Physical Layer Proposal", Samsung/Sony ATSC 3.0 PHY Layer Proposal rev6, Mar. 20, 2014, 186 pages.

* cited by examiner

LTE transport channel and physical channel processing chain: receive 5G transport channel processing chain including signal space diversity. Single antenna case Assumption about resource element mapping sequence RE mapping order due to I-Interleaver RE mapping order due to Q-Interleaver 5G transport channel processing chain including number of bits / symbols Proposed decoding chain for LTE signal space diversity using TM1 and TM2

Signal space diversity processing chain for TM2

TRANSMITTER AND RECEIVER AND METHODS OF TRANSMITTING AND RECEIVING

TECHNICAL FIELD OF THE DISCLOSURE

The present disclosure relates to transmitters, receivers and methods of transmitting and receiving payload data using Orthogonal Frequency Division Multiplexed (OFDM) symbols.

The present disclosure also relates to communications devices configured to transmit data to a wireless communications network and to receive data from the wireless communications network via a wireless access interface using a transmitter and a receiver respectively. In some embodiments the wireless access interface is configured to communicate data in accordance with a plurality of repeat request-type processes. The present invention also relates to methods of communicating using communications devices, wireless communications network, infrastructure equipment and methods.

BACKGROUND OF THE DISCLOSURE

Third and fourth generation mobile telecommunication systems, such as those based on the 3GPP defined UMTS and Long Term Evolution (LTE) architecture are able to support more sophisticated services than simple voice and messaging services offered by previous generations of mobile telecommunication systems. For example, with the improved radio interface and enhanced data rates provided by LTE systems, a user is able to enjoy high data rate applications such as mobile video streaming and mobile video conferencing that would previously only have been available via a fixed line data connection. The demand to deploy third and fourth generation networks is therefore strong and the coverage area of these networks, i.e. geographic locations where access to the networks is possible, is expected to increase rapidly.

There is also a demand to make further improvements in the efficiency with which data is communicated in future wireless communications networks. A wireless access interface provided by such future wireless communications networks may also use Orthogonal Frequency Division Multiplexing (OFDM).

OFDM is a well established technique which can be generally described as providing K narrow band sub-carriers (where K is an integer) which are modulated in parallel, each sub-carrier communicating a modulated data symbol such as for example Quadrature Amplitude Modulated (QAM) symbol or Quaternary Phase-shift Keying (QPSK) symbol. The modulation of the sub-carriers is formed in the frequency domain and transformed into the time domain for transmission. Since the data symbols are communicated in parallel on the sub-carriers, the same modulated symbols may be communicated on each sub-carrier for an extended period. The sub-carriers are modulated in parallel contemporaneously, so that in combination the modulated carriers form an OFDM symbol. The OFDM symbol therefore comprises a plurality of sub-carriers each of which has been modulated contemporaneously with different modulation symbols, which form modulation cells on the sub-carriers of the OFDM symbols. During transmission, a guard interval filled by a cyclic prefix of the OFDM symbol precedes each OFDM symbol. When present, the guard interval is dimensioned to absorb any echoes of the transmitted signal that may arise from multipath propagation.

As indicated above, the number of narrowband carriers K in an OFDM symbol can be varied depending on operational requirements of a communications system. The guard interval represents overhead and so may in some embodiments be minimized as a fraction of the OFDM symbol duration in order to increase spectral efficiency. For a given guard interval fraction, the ability to cope with increased multipath propagation whilst maintaining a given spectral efficiency can be improved by increasing the number K of sub-carriers thereby increasing the duration of the OFDM symbol. However, there can also be a reduction in robustness in the sense that it may be more difficult for a receiver to recover data transmitted using a high number of sub-carriers compared to a smaller number of sub-carriers, because for a fixed transmission bandwidth, increasing the number of sub-carriers K also means reducing the bandwidth of each sub-carrier. A reduction in the separation between sub-carriers can make demodulation of the data from the sub-carriers more difficult for example, in the presence of Doppler frequency. That is to say that although a larger number of sub-carriers (high order operating mode) can provide a greater spectral efficiency, for some propagation conditions, a target bit error rate of communicated data may require a higher signal to noise ratio to achieve than required for a lower number of sub-carriers.

As will be appreciated, therefore providing an arrangement in which signaling data and payload data can be conveyed for detection of the payload data carrying OFDM symbols can represent a significant challenge.

SUMMARY OF THE DISCLOSURE

Embodiments of the present technique can provide a transmitter for transmitting payload data using Orthogonal Frequency Division Multiplexed (OFDM) symbols, the transmitter comprising a frame builder configured to receive the payload data to be transmitted and to receive signalling data for use in detecting and recovering the payload data at a receiver, and to form the payload data into data-units for transmission. A modulator is configured to modulate a plurality of sub-carriers of one or more OFDM symbols with the signalling data and the payload data in accordance with a modulation scheme to provide for each of the plurality of sub-carriers a modulation symbol, a prefixing circuit is configured to prefix a guard interval to the one or more OFDM symbols, and a transmission circuit is configured to transmit the one or more OFDM symbols. The modulator includes a I/Q interleaver which is configured to receive real and imaginary components of the modulation symbol of each of the one or more sub-carriers of the one or more OFDM symbols and to interleave the real components of the modulation symbols differently to the imaginary components. By interleaving the real and imaginary components of the modulation symbols differently for transmission there is a greater likelihood of recovering one or both of the signalling data and the payload data. One or both of the real and imaginary components of the modulation symbols may be interleaved in time.

In some embodiments, before the real and imaginary components are interleaved, a phase rotation is applied to the modulation symbols in accordance with a rotation angle so that constellation points of the modulation scheme are rotated by the constellation angle in the complex place. The real and imaginary components of the modulation symbols are then interleaved to improve an integrity of the communicated data.

Those acquainted with OFDM will appreciate that embodiments of the present technique can apply equally for down-link communications from a base station to a communications device as well as communications from the communications device to the base station. For the example of an LTE wireless access interface it will be appreciated that Single Carrier Frequency Division Multiplexing (SC-FDMA) can be encoded using a Discrete Fourier Transform Spread OFDM (DFT-S-OFDM) structure and is hence part of the family of OFDM signals. Accordingly transmitter and receiver embodiments can be provided for both uplink as well as downlink communications.

Various further aspects and embodiments of the disclosure are provided in the appended claims, including but not limited to, a transmitter, a receiver, a communications device, infrastructure equipment, mobile communications system and a method of communicating.

BRIEF DESCRIPTION OF DRAWINGS

Embodiments of the present disclosure will now be described by way of example only with reference to the accompanying drawings in which like parts are provided with corresponding reference numerals and in which.

DESCRIPTION OF EXAMPLE EMBODIMENTS

Conventional LTE Network

Figure 1:
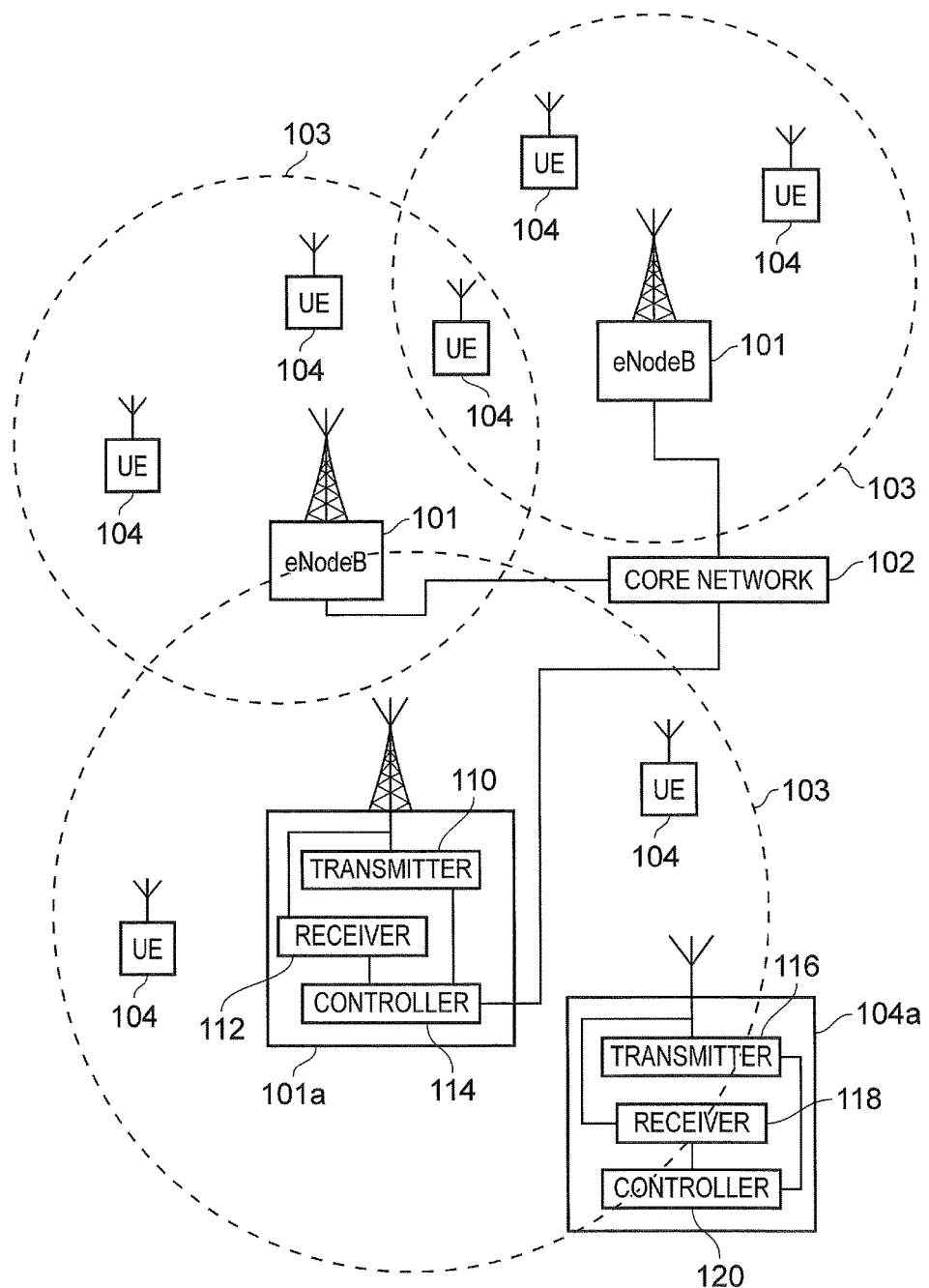
FIG. 1 provides a schematic diagram illustrating an example of a conventional mobile communications system.

FIG. 1 provides a schematic diagram illustrating some basic functionality of a mobile telecommunications network/system operating in accordance with LTE principles. Various elements of FIG. 1 and their respective modes of operation are defined in the relevant standards administered by the 3GPP® body, and also described in many books on the subject, for example, Holma H. and Toskala A [1] ISBN 9780470-319338 Fourth edition, 2007 Chapter 5. It will be appreciated that operational aspects of the telecommunications network which are not specifically described below may be implemented in accordance with any known techniques, for example according to the relevant standards.

The mobile telecommunications system, where the system shown in FIG. 1 includes infrastructure equipment comprising base stations 101 which are connected to a core network 102, which operates in accordance with a conventional arrangement which will be understood by those acquainted with communications technology. The infrastructure equipment 101 may also be referred to as a base station, network element, enhanced NodeB (eNodeB (eNB)) or a coordinating entity for example, and provides a wireless access interface to the one or more communications devices within a coverage area or cell represented by a broken line 103. One or more mobile communications devices 104 may communicate data via the transmission and reception of signals representing data using the wireless access interface. The core network 102 may also provide functionality including authentication, mobility management, charging and so on for the communications devices served by the network entity.

The mobile communications devices of FIG. 1 may also be referred to as communications terminals, user equipment (UE), terminal devices and so forth, and are configured to communicate with one or more other communications devices served by the same or a different coverage area via the network entity. These communications may be performed by transmitting and receiving signals representing data using the wireless access interface over the two way communications links.

As shown in FIG. 1, one of the eNodeBs 101a is shown in more detail to include a transmitter 110 for transmitting signals via a wireless access interface to the one or more communications devices or UEs 104, and a receiver 112 to receive signals from the one or more UEs within the coverage area 103. A controller 114 controls the transmitter 110 and the receiver 112 to transmit and receive the signals via the wireless access interface. The controller 114 may perform a function of controlling the allocation of communications resource elements of the wireless access interface and may in some examples include a scheduler for scheduling transmissions via the wireless access interface for both an uplink and a downlink.

An example UE 104a is shown in more detail to include a transmitter 116 for transmitting signals on the uplink of the wireless access interface to the eNodeB 101 and a receiver 118 for receiving signals transmitted by the eNodeB 101 on the downlink via the wireless access interface. The transmitter 116 and the receiver 118 are controlled by a controller 120.

LTE Wireless Access Interface

Mobile telecommunications systems such as those arranged in accordance with the 3GPP defined Long Term Evolution (LTE) architecture use an orthogonal frequency division modulation (OFDM) based wireless access interface for the radio downlink (so-called OFDMA) and a single carrier frequency division multiple access scheme (SC-FDMA) on the radio uplink. The down-link and the up-link of a wireless access interface according to an LTE standard is presented in FIGS. 2 and 3.

Figure 2:
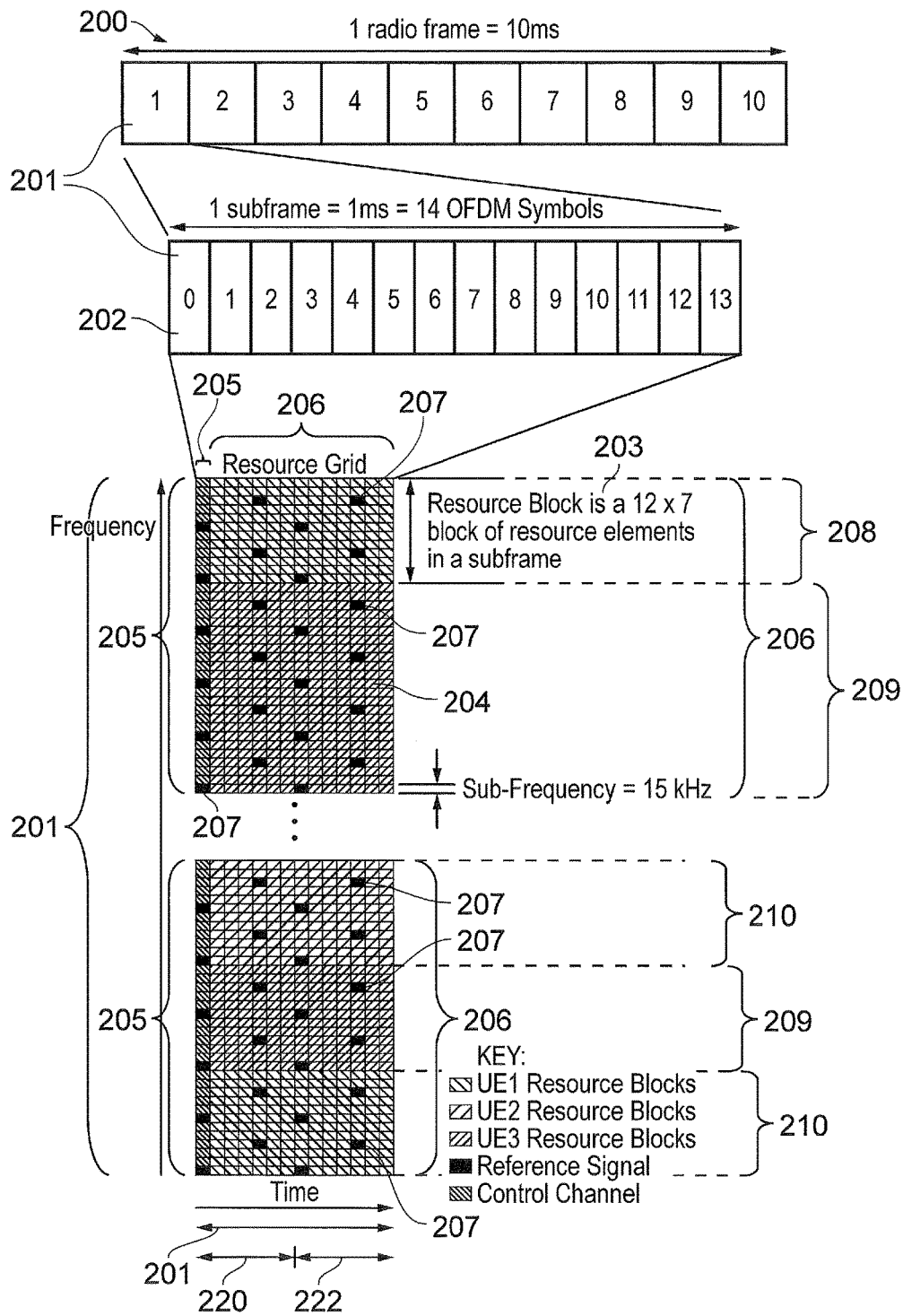
FIG. 2 provides a schematic diagram of a structure of a downlink of a wireless access interface of a mobile communications system operating according to an LTE standard.

FIG. 2 provides a simplified schematic diagram of the structure of a downlink of a wireless access interface that may be provided by or in association with the eNodeB of FIG. 1 when the communications system is operating in accordance with the LTE standard. In LTE systems the wireless access interface of the downlink from an eNodeB to a UE is based upon an orthogonal frequency division multiplexing (OFDM) access radio interface. In an OFDM interface the resources of the available bandwidth are divided in frequency into a plurality of orthogonal subcarriers and data is transmitted in parallel on a plurality of orthogonal subcarriers, where bandwidths between 1.4 MHZ and 20 MHz bandwidth may be divided into orthogonal subcarriers. Not all of these subcarriers are used to transmit data (some are used for features such as the cyclic prefix of the OFDM symbols). The number of subcarriers varies between 72 subcarriers (1.4 MHz) and 1200 subcarriers (20 MHz). In some examples the subcarriers are grouped on a basis of $2^n$, for example 128 to 2048, so that both a transmitter and a receiver can use an inverse and a forward Fast Fourier Transform to convert the sub-carriers from the frequency domain to the time domain and from the time domain to the frequency domain respectively. Each subcarrier bandwidth may take any value but in LTE it is fixed at 15 kHz.

As shown in FIG. 2, the resources of the wireless access interface are also temporally divided into frames where a frame 200 lasts 10 ms and is subdivided into 10 sub-frames 201 each within a duration of 1 ms. Each sub-frame 201 is formed from 14 OFDM symbols and is divided into two slots 220, 222 each of which comprise six or seven OFDM symbols depending on whether a normal or extended cyclic prefix is being utilised between OFDM symbols for the reduction of inter symbol interference. The resources within a slot may be divided into resources blocks 203 each comprising 12 subcarriers for the duration of one slot and the resources blocks further divided into resource elements 204 which span one subcarrier for one OFDM symbol, where each rectangle 204 represents a resource element. The resource elements distributed in time within a sub-frame and frequency across the host system band width represent the communications resources of the host system.

The simplified structure of the downlink of an LTE wireless access interface presented in FIG. 2, also includes an illustration of each sub-frame 201, which comprises a control region 205 for the transmission of control data, a data region 206 for the transmission of user data, reference signals 207 and synchronisation signals which are interspersed in the control and data regions in accordance with a predetermined pattern. The control region 204 may contain a number of physical channels for the transmission of control data, such as a physical downlink control channel (PDCCH), a physical control format indicator channel (PCFICH) and a physical HARQ indicator channel (PHICH). The data region may contain a number of physical channels for the transmission of data or control, such as a physical downlink shared channel (PDSCH), enhanced physical downlink control channel (ePDCCH) and a physical broadcast channel (PBCH). Although these physical channels provide a wide range of functionality to LTE systems, in terms of resource allocation and the present disclosure ePDCCH and PDSCH are most relevant. Further information on the structure and functioning of the physical channels of LTE systems can be found in [1].

Figure 3:
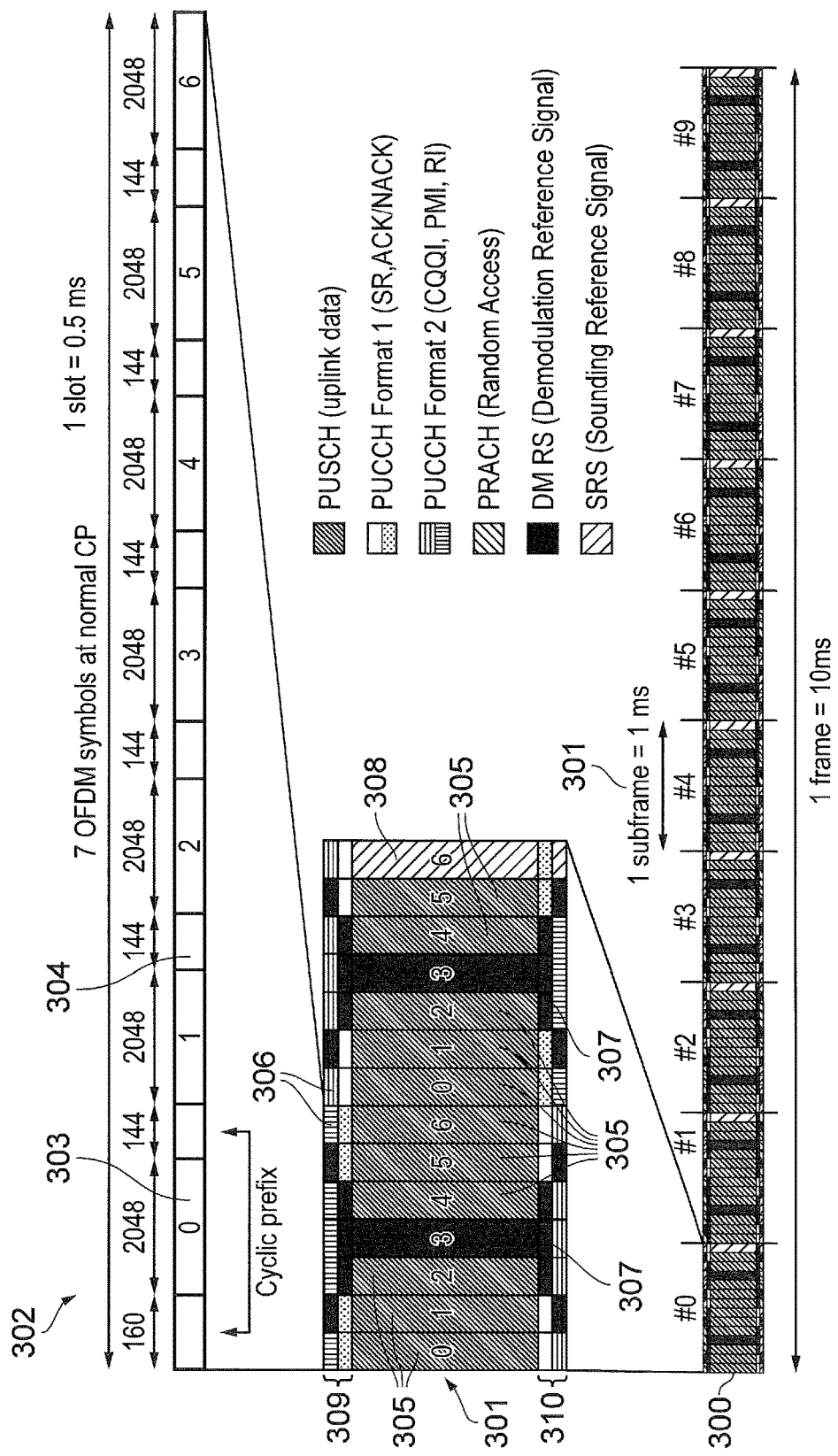
FIG. 3 provides a schematic diagram of an uplink of a wireless access interface of a mobile communications system operating according to an LTE standard.

Resources within the PDSCH may be allocated by an eNodeB to UEs being served by the eNodeB. For example, a number of resource blocks of the PDSCH may be allocated to a UE in order that it may receive data that it had previously requested or data which is being pushed to it by the eNodeB, such as radio resource control (RRC) signalling. In FIG. 3, UE1 has been allocated resources 208 of the data region 206, UE2 resources 209 and UE3 resources 210. UEs in an LTE system may be allocated a fraction of the available resources of the PDSCH and therefore UEs are required to be informed of the location of their allocated resources within the PDCSH so that only relevant data within the PDSCH is detected and estimated. In order to inform the UEs of the location of their allocated communications resource elements, resource control information specifying downlink resource allocations is conveyed across the PDCCH in a form termed downlink control information (DCI), where resource allocations for a PDSCH are communicated in a preceding PDCCH instance in the same sub-frame.

Figure 4:
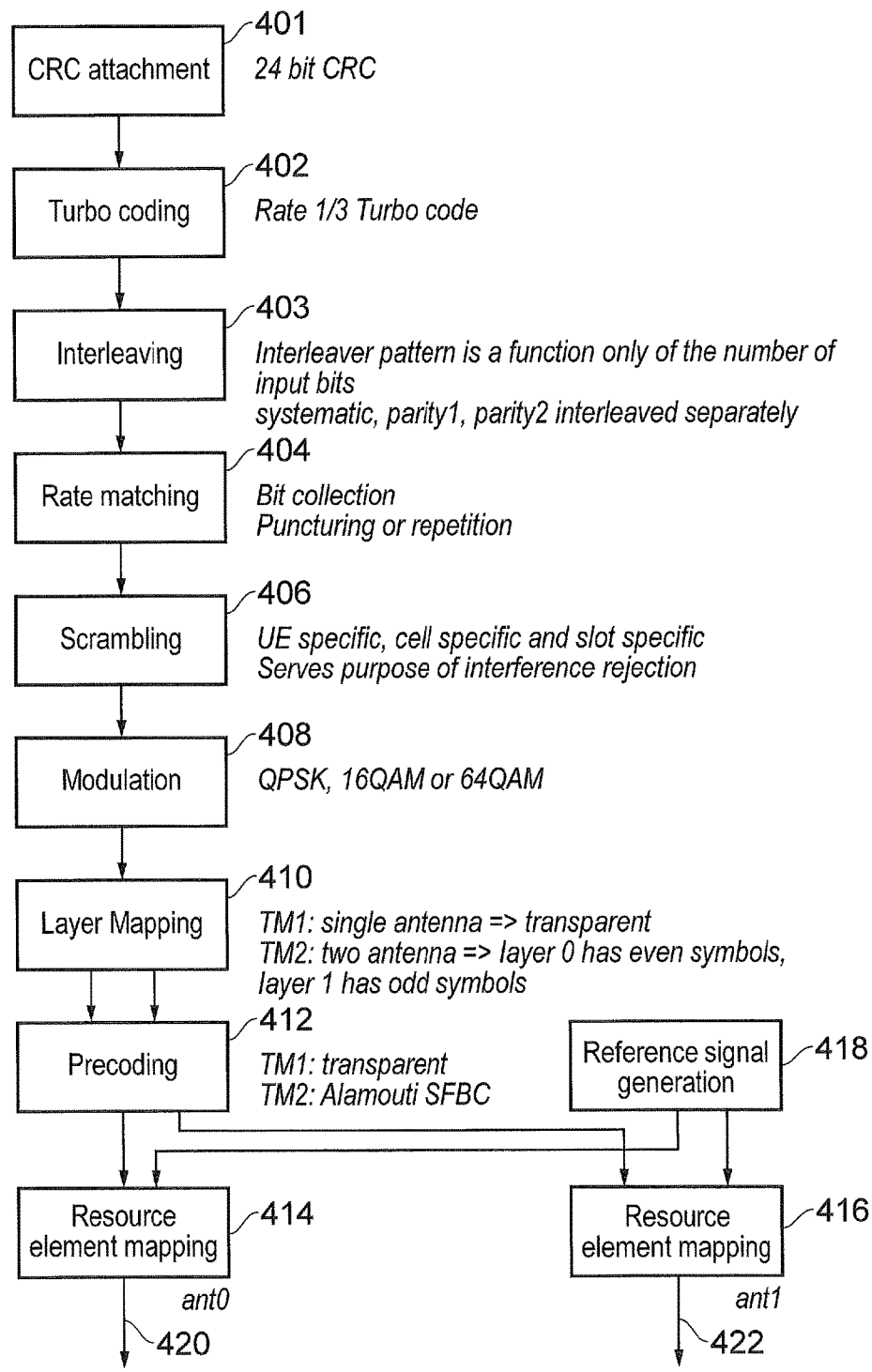
FIG. 4 is part schematic block diagram, part flow diagram illustrating process steps or transmitter blocks which form part of a transmitter in a base station or a communications device according to a previously proposed arrangement.

FIG. 3 provides a simplified schematic diagram of the structure of an uplink of an LTE wireless access interface that may be provided by or in association with the eNodeB of FIG. 1. In LTE networks the uplink wireless access interface is based upon a single carrier frequency division multiplexing FDM (SC-FDM) interface and downlink and uplink wireless access interfaces may be provided by frequency division duplexing (FDD) or time division duplexing (TDD), where in TDD implementations sub-frames switch between uplink and downlink sub-frames in accordance with predefined patterns. However, regardless of the form of duplexing used, a common uplink frame structure is utilised. The simplified structure of FIG. 4 illustrates such an uplink frame in an FDD implementation. A frame 300 is divided in to 10 sub-frames 301 of 1 ms duration where each sub-frame 301 comprises two slots 302 of 0.5 ms duration. Each slot is then formed from seven OFDM symbols 303 where a cyclic prefix 304 is inserted between each symbol in a manner equivalent to that in downlink sub-frames. More details of the LTE up-link represented in FIG. 3 are provided in Annex 1.

Physical Layer Transmission and Reception

FIG. 4 is an illustration of processing steps which are performed by a transmitter forming part of either of the eNode-b or the UE showing in FIG. 1 in accordance with a conventional arrangement of a transport chain for physical layer processing. As will be appreciated, the process step showing in FIG. 4 could also be interpreted as processing blocks or physical apparatus features of the transmitter. As shown in FIG. 4, for each transport data unit which is to be transmitted in each sub-frame, a first processing element 401 performs a cyclic redundancy check to add 24 bits to the data unit in order to confirm a successful transmission or identify a data unit which has been corrupted. In the next process step 402 turbo encoding is provided to add redundancy to the data unit and for example a third rate turbo code might be used to encode the data unit. The turbo encoded data unit is then interleaved 403 in accordance with a known pattern whereby the interleaver interleaves systematic and parity bits that are produced by the Turbo coder. The known pattern applied by the interleaver is adaptable to the number of physical bits that are eventually transmitted over the air. Rate matching is then applied 404 followed by scrambling 406 which is UE specific, cell specific and slot specific in order to reduce interference, e.g. intercell interference between transmissions from different eNodeBs. In a process step 408 the bits of the turbo encoded and scrambled data unit are mapped onto modulation symbols in accordance with a selected modulation scheme such as QPSK, 16QAM or 64 QAM.

The modulation symbols generated by the modulation step 408 are then fed to a layer mapping processor 410 which maps the modulation symbols onto either a single layer for a transmission mode (TM1) or to two layers for a second transmission mode (TM2) in which layer zero has even symbols and layer 1 has odd symbols. In TM2 Alamouti encoding is then performed on the bit streams from each layer by a pre-coding unit 412 before the respective cells of the Alamouti pairs are mapped on to separate antennas 414, 416. Reference signals which are generated and mapped within the time and frequency domain for transmission of the data unit within the sub-frame are generated by reference signal generator 418 and used to modulate selected sub-carriers and OFDM symbol of the transmitted waveform, which is transmitted from each of the different antennas from output channels 420, 422 in accordance with the Alamouti encoding.

FIG. 4 illustrates transport and physical channel processing chains for PDSCH/DL-SCH. The figure is simplified in that it shows:

Only transmit modes 1 and 2 (the Alamouti modes). More complicated modes are also supported (e.g. to support Multiple Input, Multiple Output (MIMO) techniques)

Figure 5:
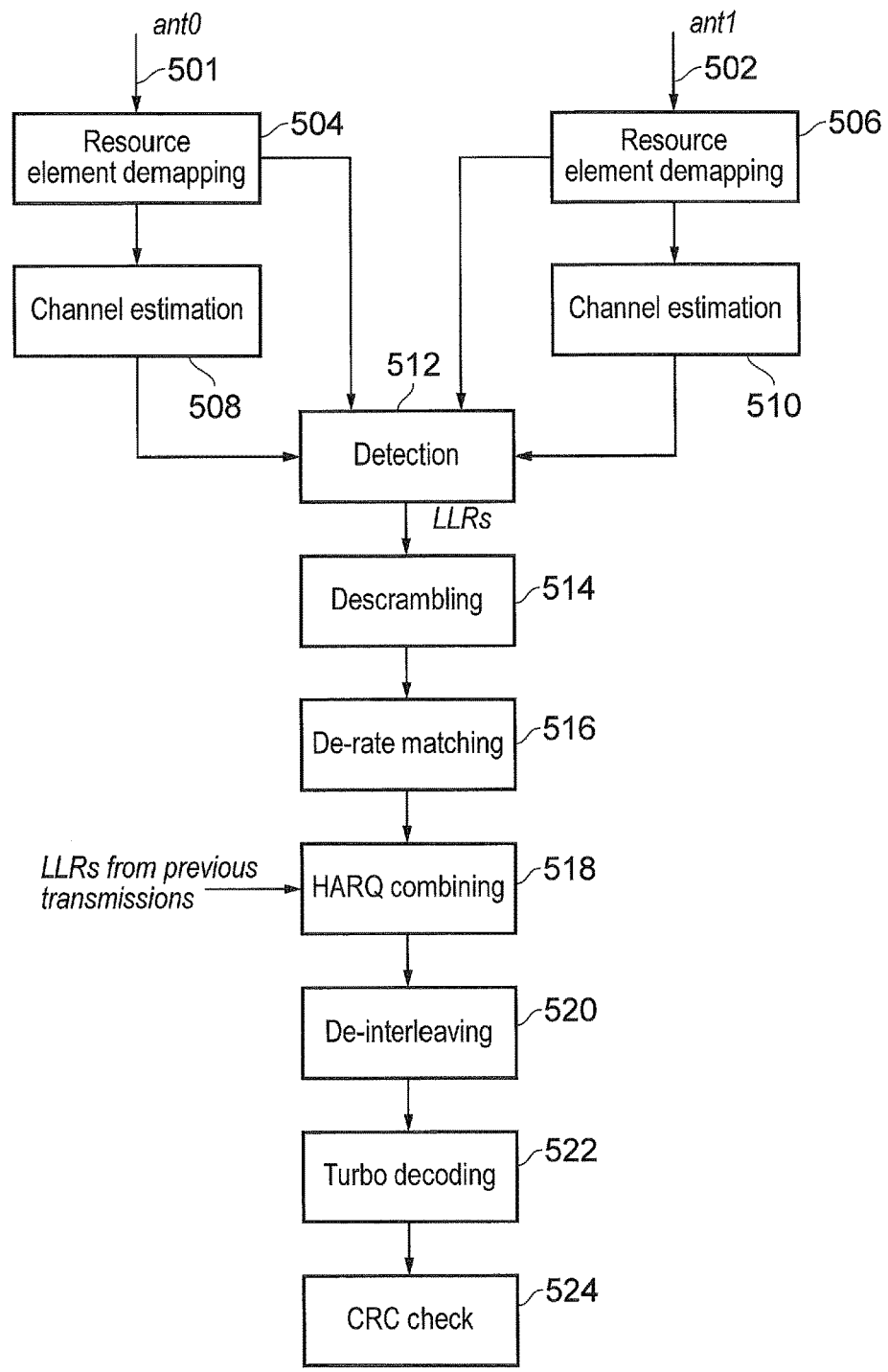
FIG. 5 is a part schematic block diagram, part flow diagram illustrating process steps or blocks of a receiver in part of the base station or the communications device in accordance with a previously proposed arrangement.

The transport channel processing chain is only shown for single codeblock transmissions. For large transport block sizes, transport blocks are segmented/concatenated into smaller code blocks around the Turbo coding function FIG. 5 shows a schematic block diagram, part flow diagram of processing elements which form part of a receiver embodied within either the base station (eNode-b) or the UE shown in FIG. 1. As shown in FIG. 5, each of first and second antennas is arranged to detect a signal which is fed from a channel 501, 502 respectively to a resource element de-mapping unit 504, 506. Channel estimation is performed by channel estimators 508, 510, for each of the respective channels using the received reference symbols before the combined signals from the first and second channels are combined by a detection unit 512. The output of the detection unit 512 is a set of log likelihood ratios (LLRs) which are then descrambled by a descrambling element 514 in accordance with the cell, UE and slot specific scrambling applied in the transmitter in step 406. De-rate matching is then performed to reverse the puncturing or repetition formed by the rate matching unit 404 in the transmitter and the log likelihood ratios for the received data unit are then combined in a buffer of a hybrid ARQ process 518 in order to decode the encoded data unit according to the third rate turbo code. Bit de-interleaving is then performed 520 on the LLRs followed by turbo decoding 522 and the CRC check performed by a CRC checking unit 524.

FIG. 5 shows one possible UE implementation of the receiver architecture for the LTE transport channel processing chain. The detection algorithm performs the processes of {un-precoding, un-layer mapping and demodulation} as a single process, producing LLRs for each bit comprising the modulation symbol.

The HARQ combining function combines and accumulates LLRs from transmissions of the same transport block. Different transmissions of the same transport block may use different redundancy versions (e.g. different sets of systematic and parity bits) in different subframes.

The current LTE modulation schemes do not separate the I (in-phase, or real) and Q (quadrature, or imaginary) portions of the signal constellation. Once modulation symbols have been created, the I and Q portions of the modulations are always transmitted together in a single modulation symbol. Signal space diversity is a transmission scheme whereby each modulation symbol is first rotated, its I and Q portions are separated, and interleaved separately and combined. When applied, each transmitted symbol would therefore be formed by I and Q components taken from different modulation symbols. Performing this set of functions improves the reliability of the transmitted data (since the I and Q portions of a modulation symbol are no longer transmitted together (in time or frequency), but are transmitted in separate physical locations (in time and frequency)). The rotation of each modulation symbol prior to separating its I and Q components changes each modulation symbol such that it can be detected and decoded solely from either its I or Q component. Hence signal space diversity transmission schemes can improve transmission robustness in fading channels.

Signal space diversity transmission techniques are known in the prior art [2] and have been applied or proposed for some standards [3]. Aspects of the disclosure relate to how signal space diversity can be applied to the LTE processing chain.

Improved Transmission/Reception Using I/Q Interleaving

TM1: Single Stream Case (1 TX Antenna, 1 RX Antenna)

Figure 6:
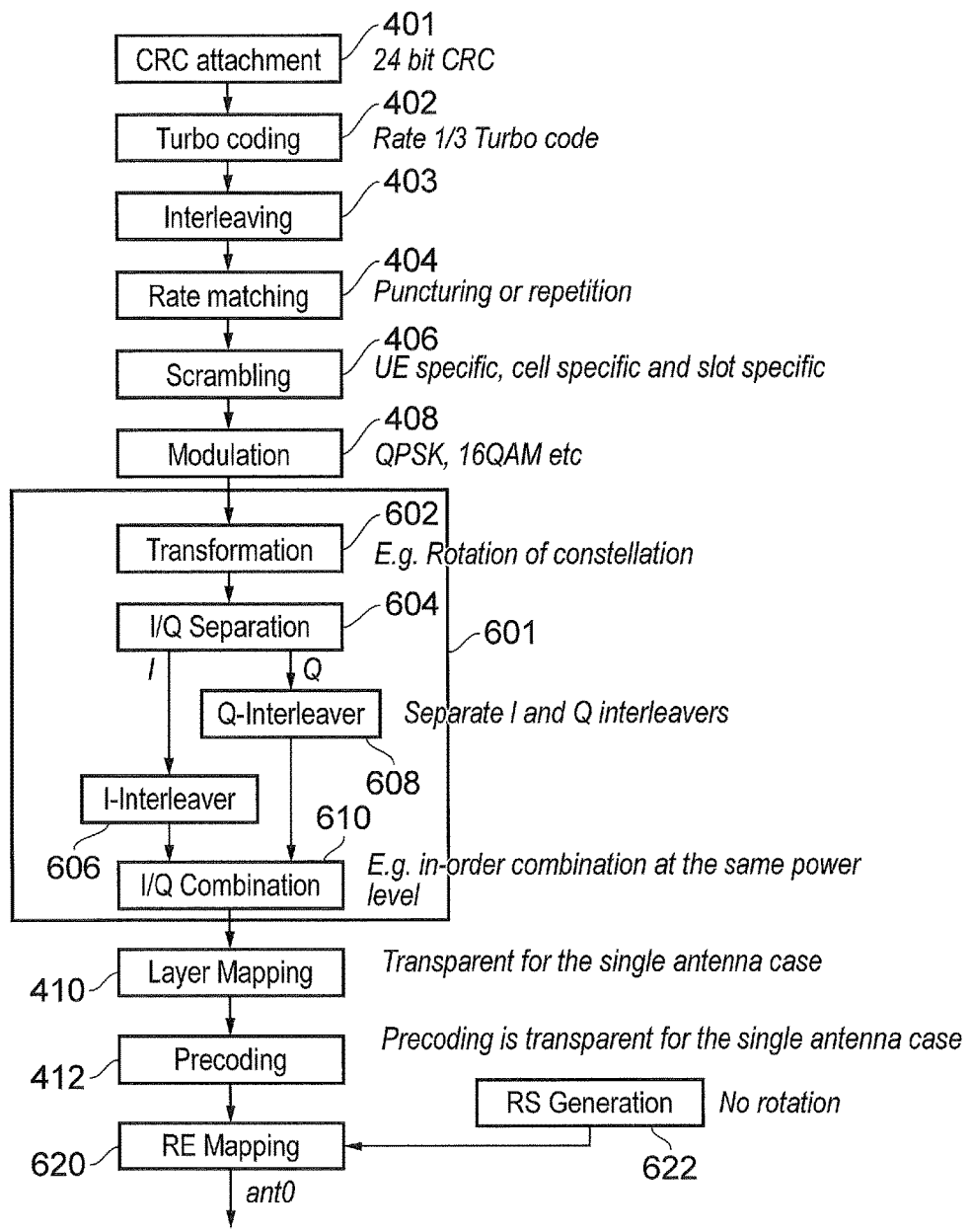
FIG. 6 is a part schematic block diagram, part flow diagram illustrating process steps or transmitter blocks of a previously proposed transmitter arrangement which includes space diversity.

FIG. 6 provides a flow diagram of process steps (or correspondingly apparatus features) which are performed by a transmitter in accordance with an embodiment of the present technique. FIG. 6 is based on the processing steps of a conventional transmitting process presented in FIG. 4 and so only the differences will be described. Corresponding steps are provided with the same numerical references. The embodiment shown in FIG. 6 considers the transport channel processing chain for a single transmit antenna. The example shown in FIG. 6 is for the LTE downlink, but it will be appreciated that this process chain can be adapted for the up-link.

As shown in FIG. 6, after the modulation 408 a transforming process 601 is applied to the modulation symbols. The transforming process 601, includes a modulation symbol phase rotation 602, an I/Q separator 604, and I-interleaver 606, a Q-interleaver 608 and an I/Q combiner 610. Otherwise processing proceeds thereafter according to a conventional operation as presented in FIG. 4. However for the single antenna example, then only a single resource element mapping process 620 and a reference symbols generator 622 are shown.

Figure 11:
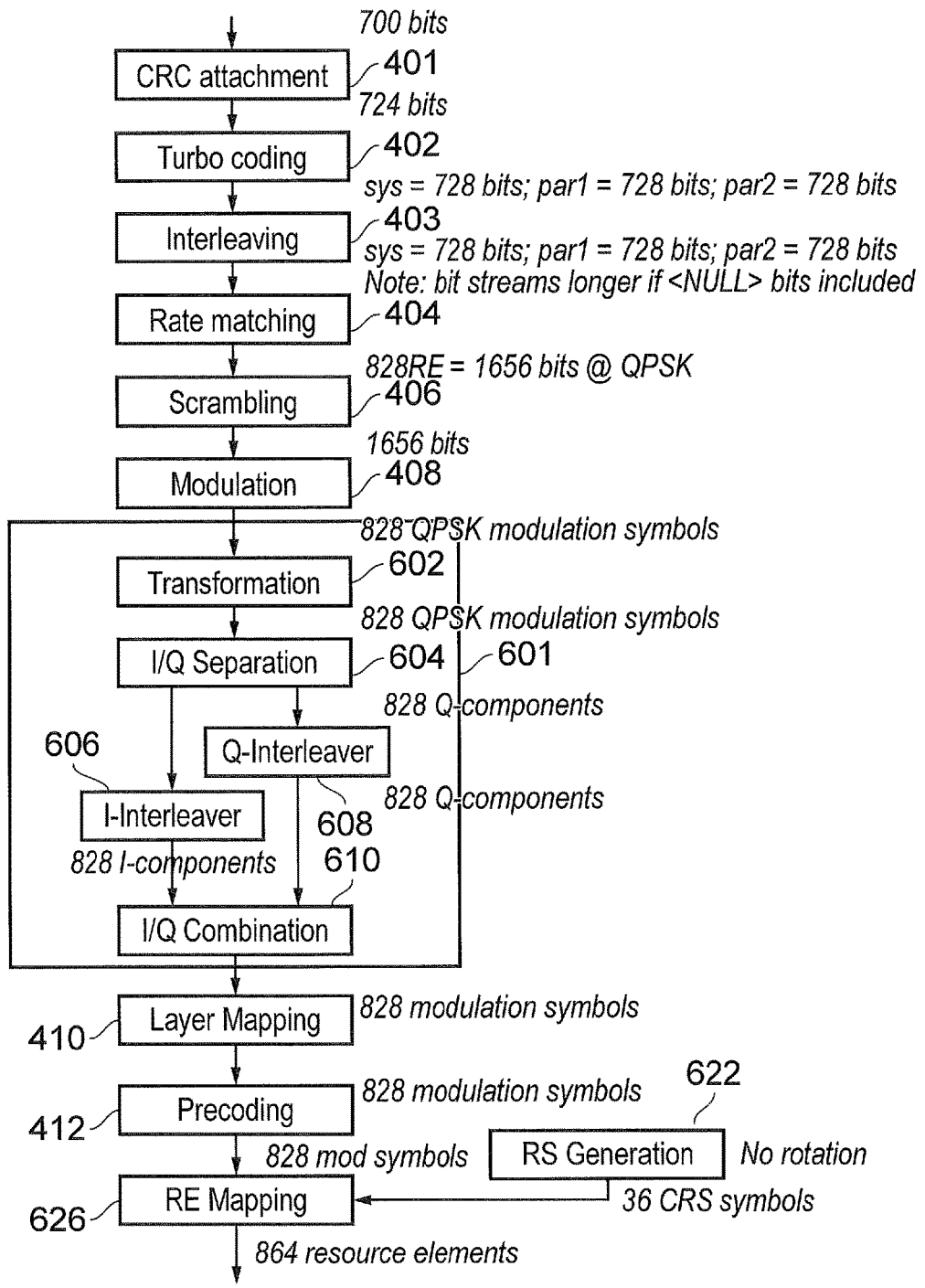
FIG. 11 is a part schematic block diagram, part flow diagram illustrating process steps or transmitter blocks of a transmitter chain in accordance with the present technique.

A receiver architecture for signal space diversity decoding is as shown in FIG. 11. Possible detection algorithms include:

ML detection (an implementation might use a reduced complexity decoding algorithm, such as soft sphere decoding (SSD)) directly producing LLRs Equalisation, MRC combining, LLR calculation Some details and examples of the processing steps shown in FIG. 6 are briefly summariased as follows:

CRC attachment: a 24 bit CRC is applied to each data unit. Turbo coding is applied at rate ⅓.

Interleaving: This a typical interleaving stage which is usually referred to as bit interleaving because it interleaves the bits of the error correction encoded data units.

Rate matching is performed by one or both of puncturing or repetition.

Scrambling is performed which is UE specific, cell specific or slot specific.

Modulation: The gains from Signal Space Diversity (SSD) may be most significant when QPSK modulation is applied. Gains are also observed for 16QAM. Gains may be less significant for modulation orders higher than 16QAM. The benefits of SSD can be more apparent in worse channel conditions, hence robust modulation formats such as QPSK can be applied to SSD in any case.

Transformation:
- In some embodiments, the transformation consists of a rotation of the modulation symbol. There is an optimum angle or at least optimised (for any modulation order) that the modulation symbol should be rotated by. Positive and negative values of this optimum angle could be applied (e.g. as a function of the MCS=modulation and coding scheme, or as a function of the RV=redundancy version).
- In general, the transformation can consist of other functions than simply rotation. For example, the modulation symbol could be reflected, constellation points could be moved or combinations of rotation and reflection could be applied.
- An optimum or optimized amount of rotation for initial transmission might be different to the optimum amount of rotation for a HARQ re-transmission. Hence the amount of rotation is not necessarily fixed and could be signalled to the UE via higher layer signalling (e.g. Radio resource control (RRC) or Downlink Control Information (DCI)).

I/Q-Interleaver:
- I-samples and Q-samples are separately interleaved.
- In some embodiments, the I-Interleaver and Q-Interleaver are arranged to maximally separate the I-samples and Q-samples in the resource element domain (maximally separate the samples in the frequency and time domain).
- The I-Interleaver and Q-Interleaver may be dimensioned to interleave a number of I-samples and Q-samples that are consistent with the amount of physical resource used for the transmission.

I/Q Combination:
- The interleaved I-samples and Q-samples are combined to form transmit symbols.
- In some embodiments, the 'n'th sample from the I-Interleaver is combined with the 'n'th sample from the Q-Interleaver to create an (I,Q) quadrature symbol.
- In other embodiments, the order of combination could be different between I-samples and Q-samples.

Layer mapping is arranged to map the modulation symbols onto a single antenna for the single antenna case or can be mapped on to multiple layers in other cases.

Precoding is a process in which precoding schemes can be applied (Space-frequency block coding (SFBC) Alamouti coding, MIMO, beamforming etc.).

Resource Element (RE) Mapping is applied to map the transmission of symbols to the resource element grid.

Reference Symbol (RS) generation is performed for example to aid channel estimation. The reference symbols do not need to be subject to the transformations mentioned above.

More detail providing example aspects and features of example embodiments are provided in the following paragraphs:

Transformation

In some embodiments, the transformation applied is a rotation. The degree of rotation can be known to the UE and the eNodeB through a number of means:
- Specified in specifications. An optimum rotation (or optimized) angle can be derived for each signal constellation and these optimum rotation angles would be specified. For example the optimum rotation angle for BPSK is 45 degrees and for QPSK is 22.5 degrees for example.
- Signalled from eNodeB. The rotation angles used can be decided by the eNodeB (up to eNodeB implementation), according to eNodeB implementation algorithms. In order to reduce the number of potential rotation angles, the eNodeB may signal a quantised version of the rotation angle or an index into a table of rotation angles
    - The signalling can be semi-static, e.g. via unicast or system information (SIB) RRC signalling
    - The signalling can be dynamic, e.g. through the DCI field of the PDCCH. In this case, the rotation angle can be changed from subframe to subframe, allowing the eNodeB to adapt to changing channel conditions
- In some embodiments, the rotation angle is a function of the modulation format. For example when BPSK is used, a rotation angle of 45 degrees is applied, when QPSK is used, a rotation angle of 22.5 degrees is applied etc.
- In another embodiment, the rotation angle is a function of the modulation and coding scheme (MCS) applied to the transmission. Rotations might be applied for lower coding rates and modulations (UEs for which low MCS are appropriate are in more challenging channel conditions where the benefit of signal space diversity is greater. There is less benefit to signal space diversity at high MCS since the amount of rotation that can be applied to higher order modulations, such as 64QAM, is less).
- The UE can blind decode a number of hypotheses for the rotation angle and decode any message received that passes a CRC check
- The UE can use a reference signal to which a rotation has been applied to determine the rotation and hence de-rotate the constellation point In other embodiments, the transformation can be:
a reflection
constellation rearrangement (whereby the bit labelling of the constellation points is changed). This technique is used in WCDMA HSPA
other non-linear transformations of the signal space
linear transform of the constellation point (moving signal points in the I and Q dimensions by known scaling factors)
combinations of the above I/Q Interleaver In some embodiments, the I and Q Interleavers have the following characteristics:
Maximally separate the I and Q samples in the resource element domain or at least increase the separation. I.e. the I-samples and Q-samples are maximally separated in time and frequency from one another. This has the benefit of providing robustness against localised fading (in the time or frequency domains).

The I-Interleaver and Q-Interleaver are dimensioned to interleave a number of samples that is consistent with the amount of physical resource used for the transmission. The interleavers used in LTE, such as the sub-block interleaver that is specified in 3GPP TS36.212 section 5.1.4.1.1 already have this property In some embodiments, one of the I-Interleaver and Q-Interleaver functions is a "pass through" function and interleaving is only performed in one interleaver.

In the following, we describe one embodiment for the I-Interleaver and Q-Interleaver in more detail.

Note: the 3GPP specification for resource element mapping states that modulation symbols are mapped to resource elements according to a rule tha the mapping to resource elements (k,l) on antenna port p not reserved for other purposes shall be in increasing order of first the index k over the assigned physical resource blocks and then the index l, starting with the first slot in a subframe.

In the following, for purposes of illustration, we describe possible I-Interleaver and Q-Interleaver functions based on the mapping shown in FIG. 6 as to the resource element mapping order.

In the signal space diversity coding scheme, the purpose of the I/Q-Interleaver is to maximally separate, or at least increase the separation of, the I and Q components in the time/frequency grid such that if there is frequency selective fading or there are high speed channels (where fading occurs between OFDM symbols within the subframe), it is unlikely that both the I and the Q components are together subjected to the fading. We consider two types of I/Q-Interleaver:

"Random interleaver". From a 3GPP perspective, the most straightforward interleaver to apply is one based on the TS36.212 block interleaver (section 5.1.4.1.1). The I-Interleaver could be a "no-interleaving" operation and the Q-Interleaver could be based on the TS36.212 block interleaver. This may not be the ideal interleaver to use because it does not maximally separate the I and Q components in the frequency and time domain, but may provide some benefits.

Deterministic interleaver. This interleaver would interleave with the intention of separating the I and Q components in frequency and time to the greatest extent possible.

Figure 7:
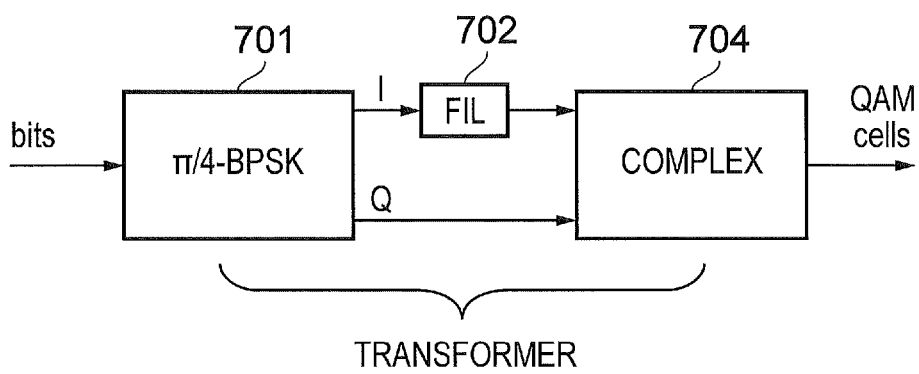
FIG. 7 is a schematic block diagram of an arrangement in which a different interleaving pattern is provided to the I and Q components of a complex signal samples of modulated symbols.

A further example of a transformation process is shown in FIG. 7. For the example shown in FIG. 7 a modulator 701 π/4-BPSK modulation to modulate data symbols of the encoded data bits. After mapping to π/4-BPSK, signal space diversity is applied by applying a I/Q interleaver only to the real component 702 of the π/4-BPSK. This is then recombined by an I/Q combiner 704 with the imaginary component to form the QAM cells.

I/Q Combination

In some embodiments, the 'n'th samples from the I-Interleaver is combined with the 'n'th sample from the Q-Interleaver and these samples are combined at their respective power levels.

An example interleaving method for the deterministic interleaver consists of both an I-interleaver and a Q-interleaver. The interleavers operate in the following manner:

| symbol | meaning |
|---|---|
| $n_{RE\_PRB}^1$ | Number of resource elements per PRB (physical resource block) in first slot of subframe |
| $n_{RE\_PRB}^2$ | Number of resource elements per PRB in second slot of subframe |
| $n_{PRB}$ | Number of PRB pairs |

Figure 8:
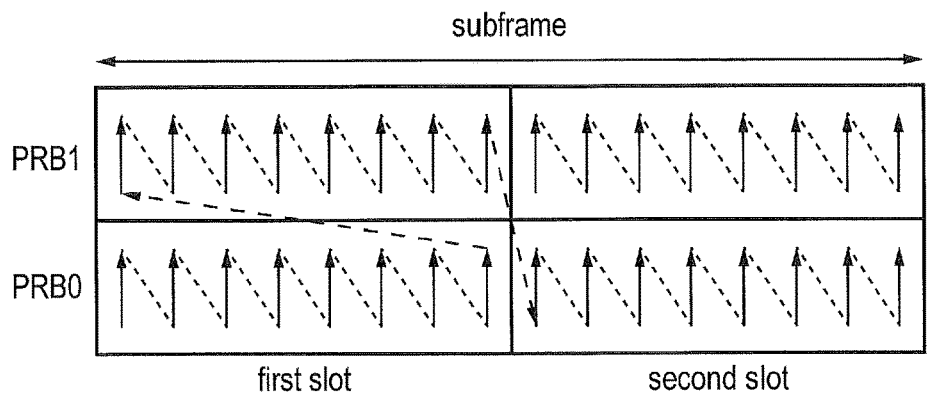
FIG. 8 is an illustrative representation showing mapping of resource elements to modulated symbols.

Note:
the number of resource elements per PRB in each slot of the subframe depends on:
number of control channel OFDM symbols
number of reference symbols For the I-Interleaver:
create a rectangular matrix containing $n_{PRB}$ rows and $n_{RE\_PRB}^1 + n_{RE\_PRB}^2$ columns
for each row in the matrix, (from row 0 to row $n_{PRB}-1$):
write I-samples in the row in a column wise fashion
read I-samples out of the matrix in the following order:
for each row starting from row 0: read out I-samples in columns 0 to $n_{RE\_PRB}^1$
then for each row starting from row 0: read out I-samples in columns $n_{RE\_PRB}^1$ to $n_{RE\_PRB}^1 + n_{RE\_PRB}^2 - 1$ For the Q-Interleaver:
create a rectangular matrix containing $n_{PRB}$ rows and $n_{RE\_PRB}^1 + n_{RE\_PRB}^2$ columns
for each row in the matrix, (from row 0 to row $n_{PRB}-1$):
write Q-samples in the row in a column wise fashion
permute the last $n_{RE\_PRB}^2$ columns of the matrix to become the first $n_{RE\_PRB}^2$ columns of the matrix (and the first $n_{RE\_PRB}^1$ to become the last)
permute the last $$\lceil \frac{n_{PRB}}{2} \rceil$$

rows of the matrix to become the first $$\lceil \frac{n_{PRB}}{2} \rceil$$

rows of the matrix
read Q-samples out of the matrix in the following order:
for each row starting from row 0: read out Q-samples in columns 0 to $n_{RE\_PRB}^1$
then for each row starting from row 0: read out Q-samples in columns $n_{RE\_PRB}^1$ to $n_{RE\_PRB}^1 + n_{RE\_PRB}^2 - 1$ Note: the number of resource elements per PRB in each slot of the subframe depends on:
number of control channel OFDM symbols FIG. 8 shows a representation of a conventional mapping of modulation symbols onto resource elements to form modulation cells without interleaving.

Figure 9:
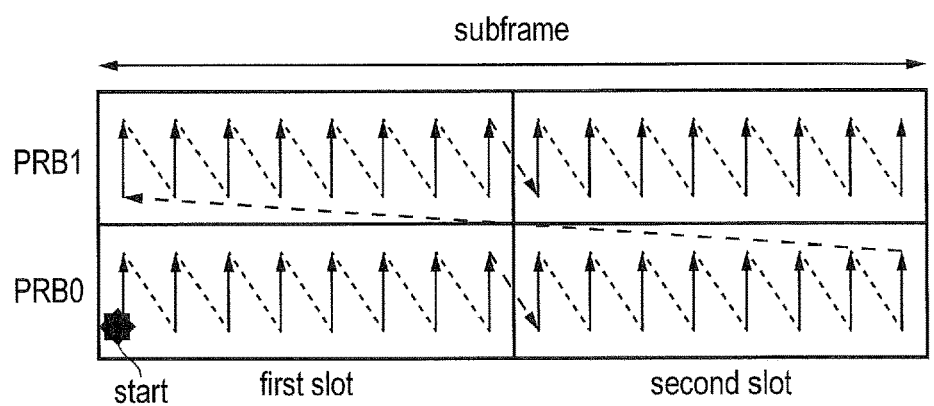
FIG. 9 is an illustrative representation of resource element mapping which has a changed order with respect to the real components of the signal samples of the modulation symbols.

FIG. 9 shows the order that I-samples at the output of the modulator are mapped to resource elements according to the described I-interleaver functionality.

Figure 10:
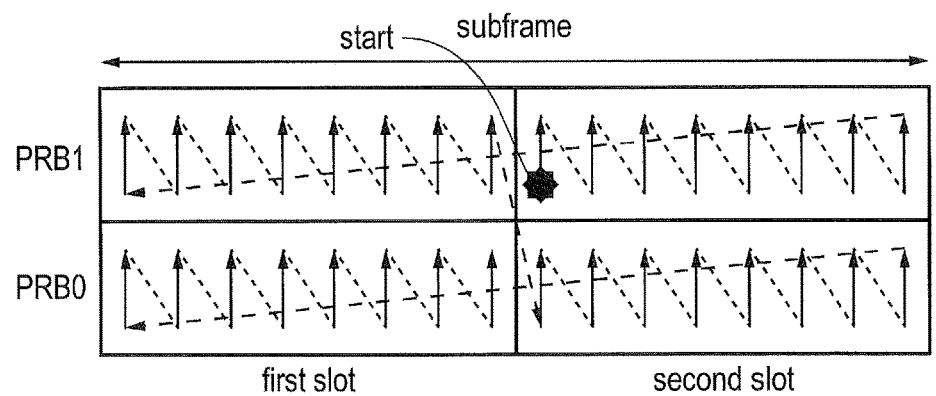
FIG. 10 is an illustrative representation of mapping of resource elements to the imaginary component of the signal samples of modulation symbols according to the present technique.

FIG. 10 shows the order that the Q-samples at the output of the modulator are mapped to resource elements according to the described Q-interleaver functionality.

Note that other interleaver functions are possible, but the distinguishing feature of the I and Q interleavers is that the function acts to separate the I and Q components of the modulation symbol stream in time and frequency.

In other embodiments:
The order of I-sample and the Q-sample combination changes from HARQ re-transmission to HARQ re-transmission due to changes in the interleaving patterns of the I-interleaver and/or Q-interleaver.

Figure 12:
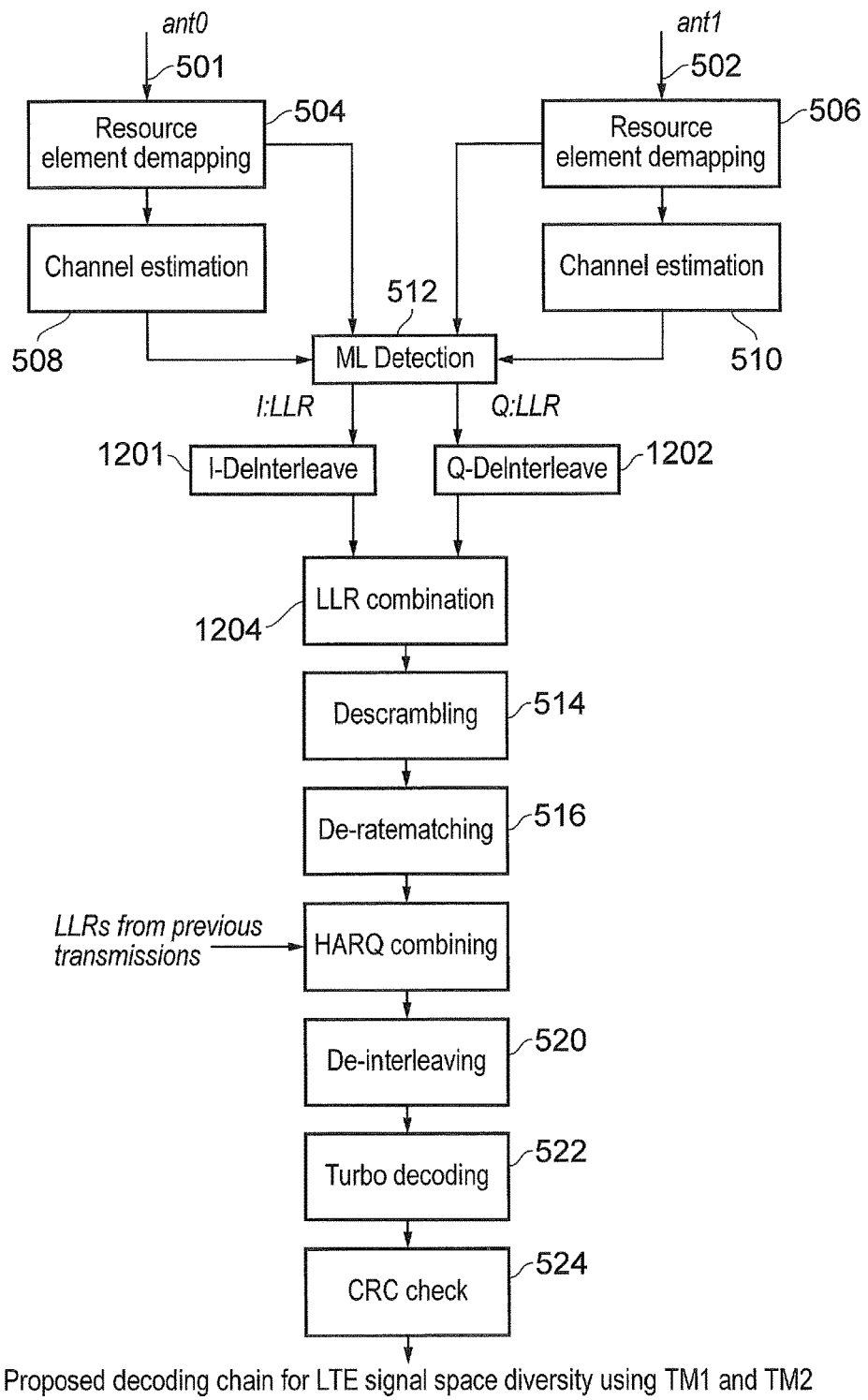
FIG. 12 is a part schematic block diagram, part flow diagram illustrating process steps or receiver blocks forming part of a receiver in accordance with the present technique.

We now discuss HARQ and repetition/TTI bundling. These are features that are not evident in the encoding function. The location of the HARQ combining buffer is evident in the receiver transport channel processing chain (FIG. 12).

HARQ

HARQ (hybrid automatic repeat request) can be applied to the transmissions, whereby the UE stores soft decision information (e.g. log likelihood ratios: LLRs) on errored packets and adds re-transmitted soft information back into the soft information from the errored packets. Conventionally, when HARQ is applied, the code rate and modulation of the re-transmissions can be different to the code rate and modulation of previous transmissions. In this invention, we obtain added diversity by allowing the "transformation", I/Q interleaving function or I/Q Combination function to change between transmissions and re-transmissions. The HARQ transmissions can change from subframe to subframe according to the following methods:

Transformation can change between transmissions
  E.g. The rotation angle of the constellation changes between HARQ re-transmissions
  E.g. On some HARQ re-transmissions, a positive angle (theta) is used and on re-transmissions, the negative of that angle (minus theta) is used The I/Q interleaver function can change between HARQ re-transmissions. The I/Q Interleavers aim to maximise the separation between the I and Q portions of the signal constellation, but the amount of separation is constrained (some I-samples are closer to their respective Q-samples than is the case for other I-samples). Hence there can be a diversity benefit by applying different I/Q interleaver functions between re-transmissions.

In one embodiment, there are two interleavers "A" and "B":
  On every 2n'th HARQ re-transmission I-samples use interleaver "A" and Q-samples use interleaver "B"
  On every 2n+1'th HARQ re-transmission, I-samples use interleaver "B" and Q-samples use interleaver "A"

Order of combination of the I-samples and Q-samples in the I/Q Combination function can change from re-transmission to re-transmission.

In some embodiments, combinations of the interleaver pattern and transformation can change between re-transmissions. The combination of interleaver pattern and rotation angle to use can be jointly coded and signalled using an index into a table. The index could also be implicitly tied to the redundancy version. E.g. there can be the following possible combinations of rotation angle and interleaving:

TABLE

Signalling combination of rotation and interleaving parameters

| Index | Combination |
|---|---|
| 0 | {+45 degree rotation, I-Interleaver = A, Q-Interleaver = B} |
| 1 | {−45 degree rotation, I-Interleaver = A, Q-Interleaver = B} |
| 2 | {+45 degree rotation, I-Interleaver = B, Q-Interleaver = A} |
| 3 | {−45 degree rotation, I-Interleaver = B, Q-Interleaver = A} |

Repetition/TTI Bundling

When coverage is constrained, repetition coding or TTI bundling can be applied to extend coverage.

Note in the "TTI bundling" technique, a single DCI (downlink control information) message, as transmitted on PDCCH, allocates a transport block to be transmitted in plural subsequent subframes, where the redundancy version parameters of the transmissions in the subsequent subframes can differ from subframe to subframe.

In an embodiment of the invention, when repetition or TTI bundling are applied, then either of the following may be changed between subframes:
  Transformation (e.g. rotation angle applied to the constellation)
  I/Q Interleaver functions FIG. 11 is a version of FIG. 6 showing the number of bits/modulation symbols at each stage of the processing chain for signal space diversity for the case where a transport block size of 700 bits is transmitted on PDSCH in the following physical resource:
  6 PRBs
  Control channel resource=2 OFDM symbols
  1 CRS antenna port (TM1).
  QPSK modulation Application to transmission mode 2: TM2 (SFBC and Alamouti coding)

Figure 13:
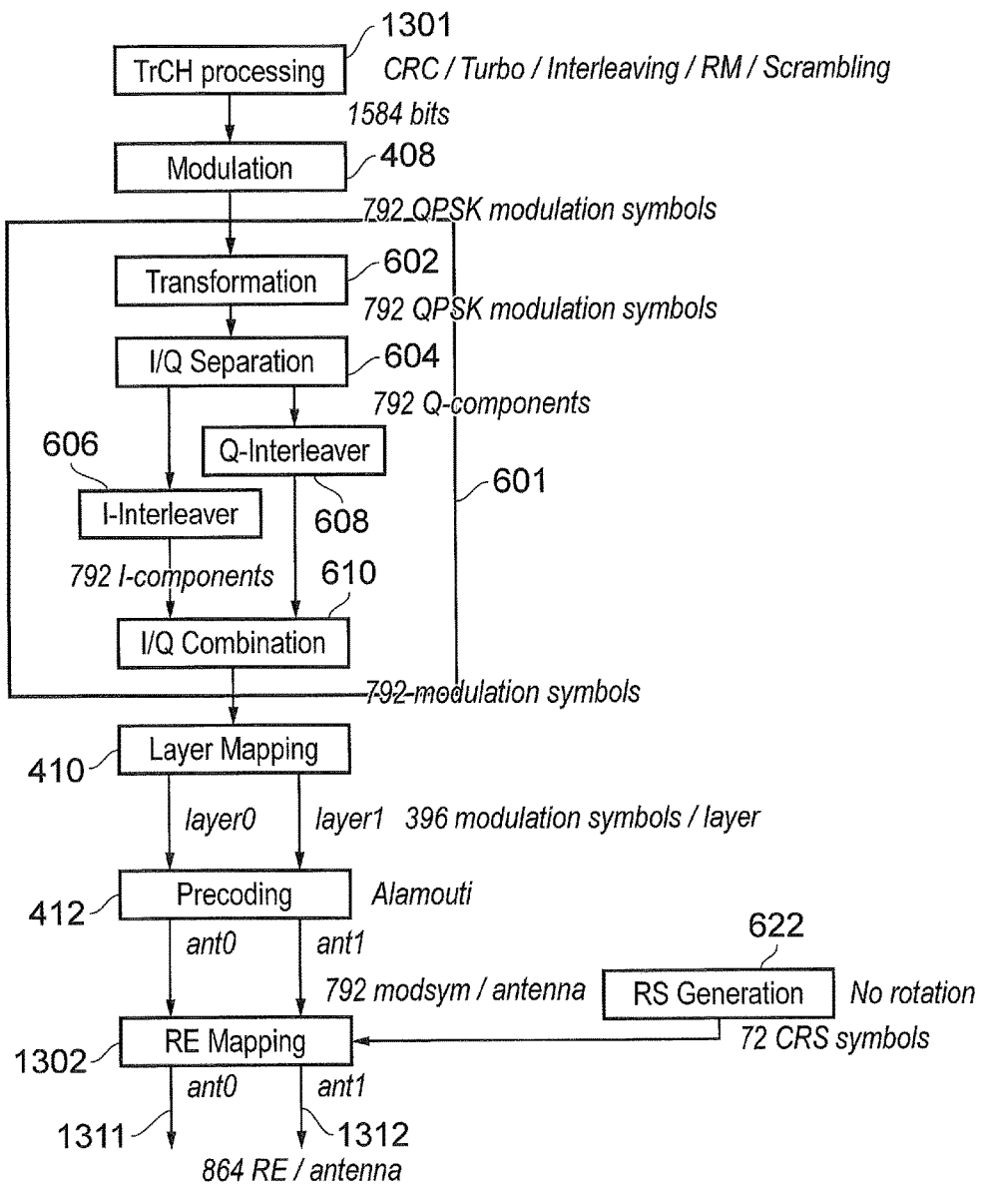
FIG. 13 is a part schematic block diagram, part flow diagram illustrating process steps or receiver blocks forming part of a space diversity processing chain for a further example of a receiver embodying the present technique.

FIGS. 12 and 13 shows the transport channel processing chain that we assume for TM2 (using SFBC/Alamouti precoding: the SFBC Alamouti precoding stage is as per LTE Release-12) adapted in accordance with the present technique. These processing chains in FIGS. 12 and 13 are based on the processing chain shown in FIGS. 5 and 6 and so corresponding features bear the same numerical references. The numbers in these Figures show the numbers of bits/modulation symbols at each stage of the transport channel processing chain for the transmission of a 700 bit transport block in 6PRB (cf FIGS. 12 and 13, but in this case we have 2 CRS antenna ports)—i.e. transport block is mapped to a subframe with the following characteristics:
  6 PRBs
  Control channel resource=2 OFDM symbols
  2 CRS antenna ports (e.g. TM2 with 2 antennas).

FIGS. 12 and 13 show the proposed decoding chain for signal space diversity when TM2 is applied with for a transmitter consisting of two transmit antennas 1311, 1312 with a Re mapping 1302 and a receiver consisting of two receive antennas 501, 502, and an I/Q deinterleaver 1201, 1202 with an LLR combiner 1204. Each of the channel estimation functions shown may produce channel estimates for both the channels to the receive antenna from both transmit antennas. The ML detection function operates on pairs of subcarriers (according to LTE SFBC rules). The details of the LLR combination function are implementation specific.

Summary of Advantages and Aspects

Embodiments of the present technique can provide a transmitter and receiver chain with the following advantages:

Improved resilience to fading in either frequency selective channels, time variant channels or channels that are both frequency selective and time variant Additional diversity to HARQ, repetition or TTI bundling functions, making the signal more resilient to fading The following aspects can be provided by embodiments of the present technique:

I/Q Interleaver structure (provides maximal separation between I-samples and Q-samples) and position in transport channel processing chain.

Interleaver size is adapted to the amount of physical resource (this would be common with existing LTE functionality)

The signal space diversity interleaving stages (e.g. Q-Interleaver as shown in FIG. 10) have different interleaving patterns applied to them for re-transmissions.

The rotation angle is changed for different re-transmissions:

Angles are different for different modulations, where the angles can be specified or signalled.

There is an optimum (or at least optimised) rotation angle for each constellation size, but plus and minus versions of that angle can be used.

Rotation angle changes between redundancy versions (when HARQ is applied) or between subframes of a TTI bundle.

Method of signalling when/how signal space diversity is applied

Tables of {interleaver, rotation}, indexed by redundancy version: e.g. Table

Rotated/transformed constellations may be linked to the MCS applied

RRC signalling

It will be appreciated that the above description for clarity has described embodiments with reference to different functional units, circuitry and/or processors. However, it will be apparent that any suitable distribution of functionality between different functional units, circuitry and/or processors may be used without detracting from the embodiments.

Described embodiments may be implemented in any suitable form including hardware, software, firmware or any combination of these. Described embodiments may optionally be implemented at least partly as computer software running on one or more data processors and/or digital signal processors. The elements and components of any embodiment may be physically, functionally and logically implemented in any suitable way. Indeed the functionality may be implemented in a single unit, in a plurality of units or as part of other functional units. As such, the disclosed embodiments may be implemented in a single unit or may be physically and functionally distributed between different units, circuitry and/or processors.

Although the present disclosure has been described in connection with some embodiments, it is not intended to be limited to the specific form set forth herein. Additionally, although a feature may appear to be described in connection with particular embodiments, one skilled in the art would recognize that various features of the described embodiments may be combined in any manner suitable to implement the technique.

Various further aspects and features of the present invention are defined in the following numbered paragraphs:

Paragraph 1: A transmitter for transmitting payload data using Orthogonal Frequency Division Multiplexed (OFDM) symbols, the transmitter comprising a frame builder configured to receive the payload data to be transmitted and to receive signalling data for use in detecting and recovering the payload data at a receiver, and to form the payload data into data-units for transmission, a modulator configured to modulate a plurality of sub-carriers of one or more OFDM symbols with the signalling data and the payload data in accordance with a modulation scheme to provide for each of the plurality of sub-carriers a modulation symbol, a prefixing circuit for prefixing a guard interval to the one or more OFDM symbols, and a transmission circuit for transmitting the one or more OFDM symbols, wherein the modulator includes a I/Q interleaver, which is configured to receive real and imaginary components of the modulation symbols for each of the one or more sub-carriers of the one or more OFDM symbols and to interleave the real component of the modulation symbols differently to the imaginary component.

Paragraph 2: A transmitter according to paragraph 1, wherein the modulation scheme is π/4-BPSK.

Paragraph 3: A transmitter according to any of paragraphs 1 to 2, wherein the I/Q interleaver is configured to interleave the real component of the modulation symbols differently to the imaginary component, an amount by which adjacent signal samples representing one or both of the real or imaginary components being separated from one another after the I/Q interleaver being determined as a function of physical resources of wireless access interface which are allocated for transmitting.

Paragraph 4: A transmitter as claimed in any of claim 1, 2 or 3, wherein at least one of the real components of the modulation symbols or the imaginary components of the modulation symbols are interleaved in time.

Paragraph 5: A transmitter according to any of paragraphs 1 to 4, wherein the I/Q interleaver forms part of transforming circuit, the transforming circuit comprising a constellation rotator configured to receive the modulation symbols from the modulator and to rotate the phase of the modulation symbols in accordance with a predetermined rotation angle.

Paragraph 6: A transmitter according to paragraph 4, wherein the transformation circuit includes an I/Q re-combiner configured to recombine signal samples representing one or both of the real or imaginary components into the modulation symbols for transmission, wherein the frequency interleaved real component of the modulation symbols is recombined with the imaginary component to form modulation cells for mapping onto the resource elements of the one or more OFDM symbols to carry the signalling data and payload data.

Paragraph 7: A transmitter according to any of paragraphs 1 to 6, including an error correction encoder configured to error correction encode data units, and a controller which is configured to control the error correction encoder, the modulator and the transmission circuit to transmit the data units of the payload data in accordance with a repeat request-type protocol, wherein the I/Q interleaver is configured to apply different interleaving patterns for different re-transmissions.

Paragraph 8: A transmitter according to paragraph 7, wherein the rotation angle applied by the constellation rotator is different for different re-transmissions.

Paragraph 9: A transmitter according to paragraph 4, wherein the rotation angle angle applied by the constellation rotator is different for different modulation schemes which are used by the modulator.

Paragraph 10: A transmitter according to paragraph 9, wherein the rotation angle is signalled to the receiver on a received signalling message.

Paragraph 11: A receiver for detecting and recovering payload data from a received signal, the receiver comprising
  a detector circuit for detecting the received signal, the received signal comprising the payload data and signalling data being carried by one or more Orthogonal Frequency Division Multiplexed (OFDM) symbols, and
  a demodulator circuit for recovering the signalling data and the payload data from the one or more OFDM symbols, by demodulating modulation cells recovered from the sub-carriers of the one or more OFDM symbols, wherein the demodulator circuit includes an I/Q de-interleaver which is configured to receive real and imaginary components of the modulation cells recovered from each of the one or more sub-carriers of the one or more OFDM symbols and to de-interleave the real component of the modulation cells differently to the imaginary component to form modulation symbols representing the signalling data and the payload data.

Paragraph 12: A receiver according to paragraph 11, wherein the demodulation circuit includes a $\pi/4$-BPSK demapper to recover the signalling data from the recovered modulation symbols, the $\pi/4$-BPSK demapper comprising separate BPSK demapping of the real and imaginary components of the received $\pi/4$-BPSK cell and then combining the soft decisions to represent a single received bit.

Paragraph 13: A receiver according to paragraph 11 or 12, wherein I/Q de-interleaver is configured to deinterleave the real component of the recovered modulation symbols differently to the imaginary component, an amount by which adjacent signal samples representing one or both of the real or imaginary components being separated from one another before the I/Q de-interleaver is determined as a function of physical resources of wireless access interface which have been allocated for transmission.

Paragraph 14: A receiver as claimed in any of claim 11, 12 or 13, wherein at least one of the real components of the modulation symbols or the imaginary components of the modulation symbols are interleaved in time.

Paragraph 15: A receiver according to any of paragraphs 11 to 14, wherein the demodulator circuit is configured to detect and to recover the signalling data and the payload data from the one or more OFDM symbols, by demodulating the modulation cells recovered from the sub-carriers of the one or more OFDM symbols in accordance with a predetermined rotation angle of the modulation symbols, to reverse a rotation of the modulation symbols applied at the transmitter.

Paragraph 16: A receiver according to any of paragraphs 11 to 15, including an error correction decoder configured to error correction decode data units, which have been error correction encoded for transmission and a controller which is configured to control the error correction decoder and the demodulation circuit to detect and to recover the data units of the payload data in accordance with a repeat request-type protocol, wherein the I/Q deinterleaver is configured to deinterleave the real and imaginary components of the received modulation cells in accordance with different interleaving patterns applied for different re-transmissions.

Paragraph 17: A transmitter for transmitting payload data using Orthogonal Frequency Division Multiplexed (OFDM) symbols, the transmitter comprising
  a frame builder configured to receive the payload data to be transmitted and to receive signalling data for use in detecting and recovering the payload data at a receiver, and to form the payload data into data-units for transmission,
  a modulator configured to modulate a plurality of sub-carriers of one or more OFDM symbols with the signalling data and the payload data in accordance with a modulation scheme to provide for each of the plurality of sub-carriers a modulation symbol, and
  a transmission circuit for transmitting the one or more OFDM symbols, wherein the modulator includes a I/Q interleaver which is configured to receive real and imaginary components of the modulation symbols for each of the one or more sub-carriers of the one or more OFDM symbols and to interleave the real component of the modulation symbols differently to the imaginary component.

REFERENCES

[1] Holma H. and Toskala A [1] ISBN 9780470-319338 Fourth edition, 2007 Chapter 5
[2] EN 302 755 v1.3.1, 'Framing structure, channel coding and modulation for a second generation digital terrestrial television broadcasting system (DVB-T2)', ETSI, April 2012.
[3] J Boutrous, E Viterbo, 'Signal Space Diversity: A Power- and Bandwidth-Efficient Diversity Technique for the Rayleight Fading Channel', pp 1453-1467, IEEE Trans. On Information Theory, Vol 44, No 4, July 1998.

Annex 1

As shown in FIG. 4, each LTE uplink sub-frame may include a plurality of different channels, for example a physical uplink communications channel (PUSCH) 305, a physical uplink control channel (PUCCH) 306, and a physical random access channel (PRACH). The physical Uplink Control Channel (PUCCH) may carry control information such as ACK/NACK to the eNodeB for downlink transmissions, scheduling request indicators (SRI) for UEs wishing to be scheduled uplink resources, and feedback of downlink channel state information (CSI) for example. The PUSCH may carry UE uplink data or some uplink control data Resources of the PUSCH are granted via PDCCH, such a grant being typically triggered by communicating to the network the amount of data ready to be transmitted in a buffer at the UE. The PRACH may be scheduled in any of the resources of an uplink frame in accordance with a one of a plurality of PRACH patterns that may be signalled to UE in downlink signalling such as system information blocks. As well as physical uplink channels, uplink sub-frames may also include reference signals. For example, demodulation reference signals (DMRS) 307 and sounding reference signals (SRS) 308 may be present in an uplink sub-frame where the DMRS occupy the fourth symbol of a slot in which PUSCH is transmitted and are used for decoding of PUCCH and PUSCH data, and where SRS are used for uplink channel estimation at the eNodeB. The ePDCCH channel carries similar control information (DCI) as the PDCCH, but the physical aspects of PDCCH are different to those of ePDCCH, as discussed elsewhere herein. Further information on the structure and functioning of the physical channels of LTE systems can be found in [1].

In an analogous manner to the resources of the PDSCH, resources of the PUSCH are required to be scheduled or granted by the serving eNodeB and thus if data is to be transmitted by a UE, resources of the PUSCH are required to be granted to the UE by the eNodeB. At a UE, PUSCH resource allocation is achieved by the transmission of a scheduling request or a buffer status report to its serving eNodeB. The scheduling request may be made, when there is insufficient uplink resource for the UE to send a buffer status report, via the transmission of Uplink Control Information (UCI) on the PUCCH when there is no existing PUSCH allocation for the UE, or by transmission directly on the PUSCH when there is an existing PUSCH allocation for the UE. In response to a scheduling request, the eNodeB is configured to allocate a portion of the PUSCH resource to the requesting UE sufficient for transferring a buffer status report and then inform the UE of the buffer status report resource allocation via a DCI in the PDCCH. Once or if the UE has PUSCH resource adequate to send a buffer status report, the buffer status report is sent to the eNodeB and gives the eNodeB information regarding the amount of data in an uplink buffer or buffers at the UE. After receiving the buffer status report, the eNodeB can allocate a portion of the PUSCH resources to the sending UE in order to transmit some of its buffered uplink data and then inform the UE of the resource allocation via a DCI in the PDCCH. For example, presuming a UE has a connection with the eNodeB, the UE will first transmit a PUSCH resource request in the PUCCH in the form of a UCI. The UE will then monitor the PDCCH for an appropriate DCI, extract the details of the PUSCH resource allocation, and transmit uplink data, at first comprising a buffer status report, and/or later comprising a portion of the buffered data, in the allocated resources.

Although similar in structure to downlink sub-frames, uplink sub-frames have a different control structure to downlink sub-frames, in particular the upper 309 and lower 310 subcarriers/frequencies/resource blocks of an uplink sub-frame are reserved for control signaling rather than the initial symbols of a downlink sub-frame. Furthermore, although the resource allocation procedure for the downlink and uplink are relatively similar, the actual structure of the resources that may be allocated may vary due to the different characteristics of the OFDM and SC-FDM interfaces that are used in the downlink and uplink respectively. In OFDM each subcarrier is individually modulated and therefore it is not necessary that frequency/subcarrier allocation are contiguous however, in SC-FDM subcarriers are modulated in combination and therefore if efficient use of the available resources are to be made, contiguous frequency allocations for each UE may be preferable.

The invention claimed is:

1. A transmitter for transmitting payload data using Orthogonal Frequency Division Multiplexed (OFDM) symbols, the transmitter comprising:
   a frame builder circuit configured to receive the payload data to be transmitted and to receive signalling data for use in detecting and recovering the payload data at a receiver, and to form the payload data into data-units for transmission;
   a modulator configured to modulate a plurality of sub-carriers of one or more OFDM symbols with the signalling data and the payload data in accordance with a modulation scheme to provide for each of the plurality of sub-carriers a modulation symbol;
   a prefixing circuit configured to prefix a guard interval to the one or more OFDM symbols;
   a transmission circuit configured to transmit the one or more OFDM symbols, wherein the modulator includes an I/Q interleaver, which is configured to receive real and imaginary components of the modulation symbol for each of the one or more sub-carriers of the one or more OFDM symbols and to interleave the real component of the modulation symbols differently to the imaginary component, at least one of the real components of the modulation symbols or the imaginary components of the modulation symbols being interleaved in time; and
   a transforming circuit that includes an I/Q re-combiner configured to recombine signal samples representing one or both of the real or imaginary components into the modulation symbols for transmission, wherein the frequency interleaved real component of the modulation symbols is recombined with the imaginary component to form modulation cells for mapping onto resource elements of the one or more OFDM symbols to carry the signalling data and payload data.

2. The transmitter as claimed in claim 1, wherein the modulation scheme is $\pi/4$-BPSK.

3. The transmitter as claimed in claim 1, wherein the I/Q interleaver is configured to interleave the real component of the modulation symbols differently to the imaginary component, an amount by which adjacent signal samples representing one or both of the real or imaginary components being separated from one another after the I/Q interleaver being determined as a function of physical resources of wireless access interface which are allocated for transmitting.

4. The transmitter as claimed in claim 1, wherein the I/Q interleaver forms part of the transforming circuit, the transforming circuit comprising a constellation rotator configured to receive the modulation symbols from the modulator and to rotate a phase of the modulation symbols in accordance with a predetermined rotation angle.

5. The transmitter as claimed in claim 4, wherein the rotation angle applied by the constellation rotator is different for different re-transmissions.

6. The transmitter as claimed in claim 4, wherein the rotation angle applied by the constellation rotator is different for different modulation schemes which are used by the modulator.

7. The transmitter as claimed in claim 6, wherein the rotation angle is signalled to the receiver on a received signalling message.

8. The transmitter as claimed in claim 1, further comprising an error correction encoder configured to error correction encode data units, and a controller which is configured to control the error correction encoder, the modulator and the transmission circuit to transmit the error correction encoded data units of the payload data in accordance with a repeat request-type protocol, wherein the I/Q interleaver is configured to apply different interleaving patterns for different re-transmissions.

9. A receiver for detecting and recovering payload data from a received signal, the receiver comprising:
   a detector circuit configured to detect the received signal, the received signal comprising the payload data and signalling data being carried by one or more Orthogonal Frequency Division Multiplexed (OFDM) symbols; and
   a demodulator circuit configured to recover the signalling data and the payload data from the one or more OFDM symbols, by demodulating modulation cells recovered from the sub-carriers of the one or more OFDM symbols, wherein the demodulator circuit includes an I/Q de-interleaver which is configured to receive real and imaginary components of the modulation cells recovered from each of the one or more sub-carriers of the one or more OFDM symbols and to de-interleave the real component of the modulation cells differently to the imaginary component to form modulation symbols representing the signalling data and the payload data, wherein the demodulator circuit is configured to detect and to recover the signalling data and the payload data from the one or more OFDM symbols, by demodulating the modulation cells recovered from the sub-carriers of the one or more OFDM symbols in accordance with a predetermined rotation angle of the modulation symbols, to reverse a rotation of the modulation symbols applied at a transmitter, and the rotation angle is different for different modulation schemes which are used by a modulator at the transmitter.

10. The receiver as claimed in claim 9, wherein the demodulator circuit includes π/4-BPSK demapper to recover the signalling data from the recovered modulation symbols, the a π/4-BPSK demapper comprising separate BPSK demapping of the real and imaginary components of the received π/4-BPSK cell and then combining the soft decisions to represent a single received bit.

11. The receiver as claimed in claim 9, wherein the IQ de-interleaver is configured to deinterleave the real component of the recovered modulation symbols differently to the imaginary component, an amount by which adjacent signal samples representing one or both of the real or imaginary components being separated from one another before the I/Q de-interleaver is determined as a function of physical resources of wireless access interface which have been allocated for transmission.

12. The receiver as claimed in claim 9, wherein at least one of the real components of the modulation symbols or the imaginary components of the modulation symbols are interleaved in time.

13. The receiver as claimed in claim 9, further comprising an error correction decoder configured to error correction decode data units, which have been error correction encoded for transmission and a controller which is configured to control the error correction decoder and the demodulation circuit to detect and to recover the data units of the payload data in accordance with a repeat request-type protocol, wherein the I/Q deinterleaver is configured to deinterleave the real and imaginary components of the received modulation cells in accordance with different interleaving patterns applied for different re-transmissions.

14. The receiver as claimed in claim 9, wherein the rotation angle is different for different re-transmissions.

15. The receiver as claimed in claim 9, wherein the rotation angle is signalled by the transmitter on a received signalling message.

16. A method of transmitting payload data using Orthogonal Frequency Division Multiplexed (OFDM) symbols, the method comprising:

receiving the payload data to be transmitted and receiving signalling data for use in detecting and recovering the payload data at a receiver, and forming the payload data into data-units for transmission;

modulating by circuitry a plurality of sub-carriers of one or more OFDM symbols with the signalling data and the payload data in accordance with a modulation scheme to provide for each of the plurality of sub-carriers a modulation symbol;

prefixing a guard interval to the one or more OFDM symbols;

transmitting the one or more OFDM symbols, wherein the modulating includes I/Q interleaving real and imaginary components of the modulation symbol for each of the one or more sub-carriers of the one or more OFDM symbols to form modulation cells for the sub-carriers of the OFDM symbols, the interleaving being different for the real components to the imaginary components, at least one of the real components of the modulation symbols or the imaginary components of the modulation symbols being interleaved in time; and recombining signal samples representing one or both of the real or imaginary components into the modulation symbols for transmission, wherein the frequency interleaved real component of the modulation symbols is recombined with the imaginary component to form modulation cells for mapping onto resource elements of the one or more OFDM symbols to carry the signalling data and payload data.

17. A method comprising detecting and recovering, by another circuitry, the payload data from a signal transmitted by the method according to claim 16.

18. A method of detecting and recovering payload data from a received signal, the method comprising:

detecting the received signal, the received signal comprising the payload data and signalling data being carried by one or more Orthogonal Frequency Division Multiplexed (OFDM) symbols;

recovering by circuitry the signalling data and the payload data from the one or more OFDM symbols, by demodulating modulation cells recovered from the sub-carriers of the one or more OFDM symbols, wherein the demodulating includes I/Q de-interleaving the real and imaginary components of the modulation cells recovered from each of the one or more sub-carriers of the one or more OFDM symbols, de-interleaving of the real component of the modulation cells being different to the imaginary component to form modulation symbols representing the signalling data and the payload data, wherein the demodulating includes detecting and recovering the signalling data and the payload data from the one or more OFDM symbols, by demodulating the modulation cells recovered from the sub-carriers of the one or more OFDM symbols in accordance with a predetermined rotation angle of the modulation symbols, to reverse a rotation of the modulation symbols applied at a transmitter, and the rotation angle is different for different modulation schemes which are used by a modulator at the transmitter.

19. A non-transitory computer storage medium comprising computer executable instructions which when loaded onto a computer cause the computer to perform the method according to claim 18.

20. A method of transmitting payload data using Orthogonal Frequency Division Multiplexed (OFDM) symbols, the method comprising:

receiving the payload data to be transmitted and receiving signalling data for use in detecting and recovering the payload data at a receiver, and forming the payload data into data-units for transmission;

modulating by circuitry a plurality of sub-carriers of one or more OFDM symbols with the signalling data and the payload data in accordance with a modulation scheme to provide for each of the plurality of sub-carriers a modulation symbol;

prefixing a guard interval to the one or more OFDM symbols;

transmitting the one or more OFDM symbols, wherein the modulating includes I/Q interleaving real and imaginary components of the modulation symbol for each of the one or more sub-carriers of the one or more OFDM symbols to form modulation cells for the sub-carriers of the OFDM symbols, the interleaving being different for the real components to the imaginary components;

receiving the modulation symbols and rotating a phase of the modulation symbols in accordance with a predetermined rotation angle, the rotation angle being different for different re-transmissions; and transmitting error correction encoded data units of the payload data in accordance with a repeat request-type protocol, the I/O interleaving applying different interleaving patterns for different re-transmissions.

* * * * *